United States Patent
Tokita (10) Patent No.: US 7,468,780 B2
(45) Date of Patent: Dec. 23, 2008

(54) EXPOSURE APPARATUS AND METHOD

(75) Inventor: Toshinobu Tokita, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/742,720

(22) Filed: May 1, 2007

(65) Prior Publication Data

US 2007/0285640 A1 Dec. 13, 2007

Related U.S. Application Data

(62) Division of application No. 11/014,166, filed on Dec. 17, 2004, now Pat. No. 7,227,615.

(30) Foreign Application Priority Data

Dec. 26, 2003 (JP) ............................ 2003-433008

(51) Int. Cl.
G03B 27/42 (2006.01)
G03B 27/52 (2006.01)

(52) U.S. Cl. .......................... 355/53; 355/30
(58) Field of Classification Search ................ 355/30, 355/53, 55, 67; 250/548
See application file for complete search history.

(56) References Cited

U.S. PATENT DOCUMENTS

| 4,935,151 | A | * | 6/1990 | Do | 210/739 |
| 5,959,304 | A | | 9/1999 | Tokita et al. | 250/492.2 |
| 5,993,518 | A | * | 11/1999 | Tateyama | 95/261 |
| 6,559,927 | B1 | | 5/2003 | Tokita et al. | 355/72 |
| 6,804,323 | B2 | | 10/2004 | Moriya et al. | 378/35 |
| 6,867,844 | B2 | * | 3/2005 | Vogel et al. | 355/30 |
| 6,876,438 | B2 | | 4/2005 | Tokita | 355/72 |
| 6,952,253 | B2 | * | 10/2005 | Lof et al. | 355/30 |
| 2005/0074704 | A1 | | 4/2005 | Endo et al. | 430/322 |
| 2005/0219490 | A1 | | 10/2005 | Owa | 355/53 |
| 2005/0259234 | A1 | | 11/2005 | Hirukawa et al. | 355/53 |
| 2007/0009841 | A1 | | 1/2007 | Endo et al. | 430/331 |

FOREIGN PATENT DOCUMENTS

| CN | 1606128 | | 4/2005 |
| JP | 59011992 | * | 2/1984 |
| WO | WO 99/49504 | | 9/1999 |

OTHER PUBLICATIONS

Chinese Office Action dated Dec. 8, 2006, issued in corresponding Chinese patent application No. 2004-100114865, and English Translation.

Korean Office Action dated Apr. 17, 2006, issued in corresponding Korean patent application No. 10-2004-0110851, with English translation.

Smith, Bruce, et al. "Extreme-NA Water Immersion Lithography for 35-65 nm Technology," Rochester Institute of Technology, International Symposium on 157 nm Lithography, Sep. 3-6, 2002. pp. 1-15.

* cited by examiner

*Primary Examiner*—Hung Henry Nguyen
(74) *Attorney, Agent, or Firm*—Fitzpatrick, Cella, Harper & Scinto (57) ABSTRACT

An exposure method including the steps of introducing fluid between a surface of an object to be exposed, and a final surface of a projection optical system, displacing an interface of the fluid arranged between the surface of the object and the final surface of the projection optical system, removing a gas from the fluid having a displaced interface, and projecting a pattern on a mask onto the object via the projection optical system and the fluid.

1 Claim, 9 Drawing Sheets

EXPOSURE APPARATUS AND METHOD

This application is a divisional application of U.S. patent application Ser. No. 11/014,166, filed Dec. 17, 2004 which is now U.S. Pat. No. 7,227,515.

BACKGROUND OF THE INVENTION

The present invention relates generally to an exposure apparatus and a method used to fabricate various devices including semiconductor chips such as ICs and LSIs, display devices such as liquid crystal panels, sensing devices such as magnetic heads, and image pick-up devices such as CCDs, as well as fine patterns used for micromechanics, and more particularly to an immersion type exposure method and apparatus that immerse the final surface of the projection optical system and the surface of the object in the fluid and expose the object through the fluid.

A projection exposure apparatus has been conventionally used to transfer a circuit pattern on a reticle (or a mask) via a projection optical system onto a wafer etc. and high-quality exposure at a high resolution has recently been increasingly demanded. The immersion exposure has attracted attention as one means to meet this demand. The immersion exposure promotes a higher numerical aperture ("NA") by replacing a medium (typically air) at the wafer side of the projection exposure with a fluid. The projection exposure apparatus has an NA=n·sin θ where n is a refractive index of the medium, and the NA increases when the medium has a refractive index higher than the air's refractive index, i.e., n>1.

Figure 9:
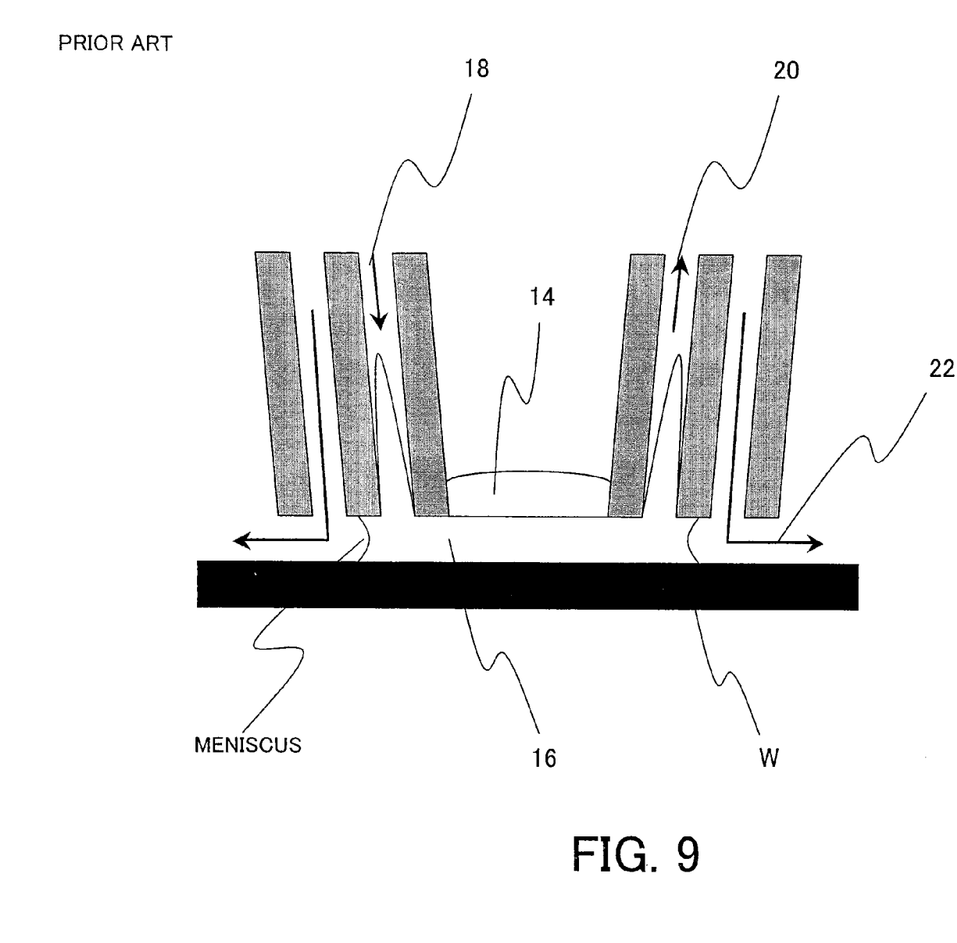
FIG. 9 is a partially-enlarged sectional view of a conventional immersion type exposure apparatus.

For the immersion exposure, some methods have already been proposed which fill the fluid between the object to be exposed, and the optical element in the projection optical system that is closest to the object. See, for example, International Publication No. WO99/49504, and International Symposium on 157 nm Lithography, 3-6 Sep. 2002, Belgium, Bruce Smith et al. (Rochester Institute of Technology), Extreme-NA Wafer Immersion Lithography for 35-65 nm Technology. These prior art references propose to provide, as shown in FIG. 9, a supply nozzle 18 and a recovery nozzle 20 near a final lens 14 in the projection optical system, and to supply fluid 16 from the supply nozzle 18 between the substrate W and the final lens 14. In addition, an air curtain is formed by blowing compressed air to the outside of the fluid 16 and maintaining the fluid 16 between the substrate W and the final lens 14. Here, FIG. 9 is a schematic sectional view for explaining the fluid supply and recovery by a conventional immersion type exposure apparatus. Upon introduction of the fluid 16, an interval between the substrate W and the final lens 14 is maintained to be a necessary interval for exposure, and the exposure becomes immediately ready after the introduction. The exposure is performed, while the supply nozzle 18 continuously supplies the fluid 16 and the recovery nozzle 20 continuously recovers the fluid 16 or while the fluid 16 circulates between the substrate W and the final lens 14.

However, the conventional immersion exposure shown in FIG. 9 causes, when the end of the substrate W is located inside of the outer edge of the supply nozzle 18, dropping of the fluid 16 supplied from the supply nozzle 18. Since the recovery nozzle 20 collects the fluid 16, no fluid 16 exists between the final lens 14 and the substrate W, or at least air bubbles mix. The air bubbles shield the exposure light, resulting in lowered transfer accuracy and yield, so that the demand for the high-quality exposure cannot be satisfied. The air bubbles cannot be eliminated even when the fluid 16 is supplied and recovered continuously.

Even when there is fluid between the substrate W and the final lens 14 as a result of the initial filling, etc., if the surface of this fluid is spaced from the surface of the fluid supplied from the supply nozzle 18, the contact of these surfaces of the fluids by the continuous supply of the fluid from the supply nozzle 18 is likely to generate air bubbles.

BRIEF SUMMARY OF THE INVENTION

Accordingly, it is an exemplary object of the present invention to provide an exposure method and an exposure apparatus, each of which prevents the mixture of air bubbles and provides the high-quality exposure.

An exposure method according to one aspect of the present invention includes the steps of introducing fluid between a surface of an object to be exposed, and a final surface of a projection optical system, displacing an interface of the fluid arranged between the surface of the object and the final surface of the projection optical system, and projecting a pattern on a mask onto the object via the projection optical system and the fluid.

An exposure method according to another aspect of the present invention includes the steps of introducing, via a supply nozzle, fluid between a surface of an object to be exposed, and a final surface of a projection optical system, removing gas from the fluid in the supply nozzle, and projecting a pattern on a mask onto the object via the projection optical system and the fluid.

An exposure apparatus, according to still another aspect of the present invention for projecting, via a projection optical system and fluid, a pattern on a mask onto an object to be exposed, while immersing a surface of the object and a final surface of the projection optical system in the fluid, includes a supply nozzle for introducing the fluid between the surface of the object and the final surface of the projection optical system, and a displacement unit, provided to the supply nozzle, for displaying an interface of the fluid between the surface of the object and the final surface of the projection optical system.

An exposure apparatus, according to still another aspect of the present invention for projecting, via a projection optical system and fluid, a pattern on a mask onto an object to be exposed, while immersing a surface of the object and a final surface of the projection optical system in the fluid, includes a supply nozzle for introducing the fluid between the surface of the object and the final surface of the projection optical system, and a gas-liquid separator, provided to the supply nozzle, for removing gas from the liquid at the supply nozzle.

A device manufacturing method includes the steps of exposing an object using the above exposure apparatus, and developing an object that has been exposed.

Other objects and further features of the present invention will become readily apparent from the following description of the preferred embodiments with reference to the accompanying drawings.

DETAILED DESCRIPTION OF THE PREFERRED EMBODIMENTS

Figure 1:
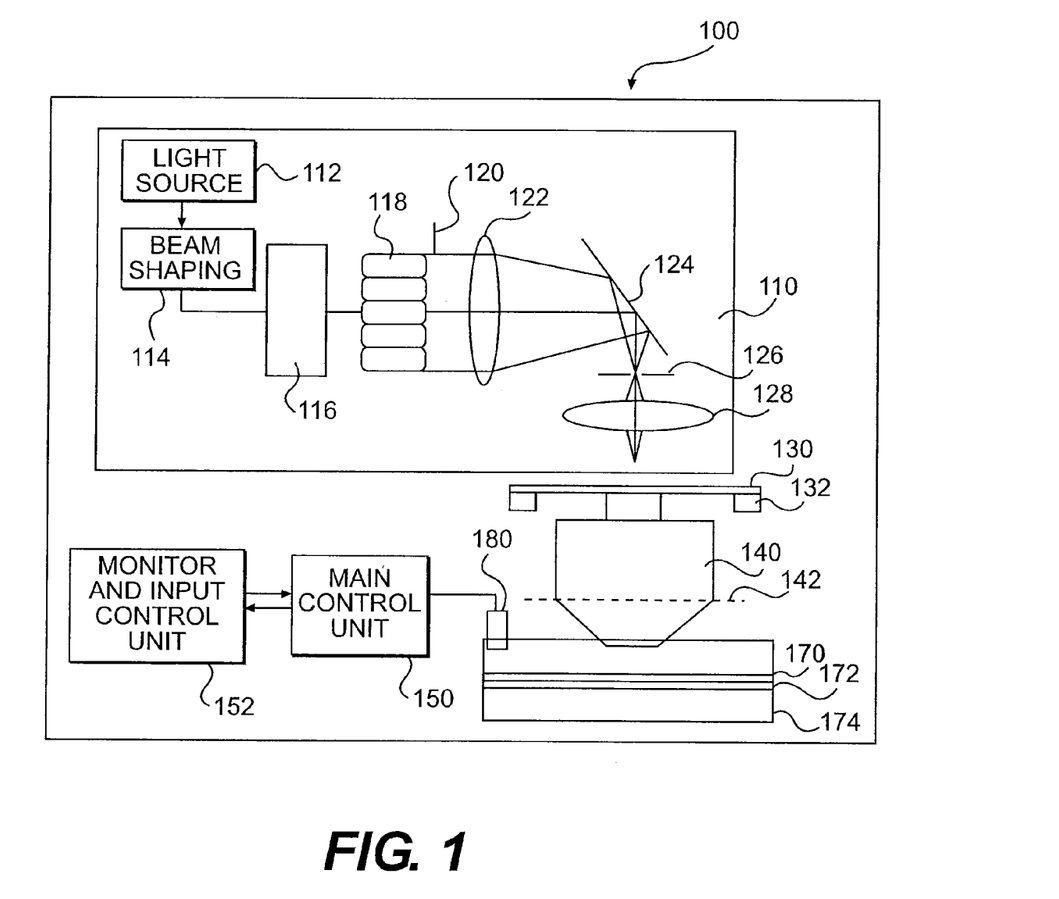
FIG. 1 is a schematic block diagram of an exposure apparatus according to one embodiment of the present invention.

Referring now to FIG. 1, a description will be given of an exposure apparatus 100 of one embodiment according to the present invention. Here, FIG. 1 is a schematic block diagram of the exposure apparatus 100. The exposure apparatus 100 includes, as shown in FIG. 1, an illumination apparatus 110, a mask (or a reticle) 130, a reticle stage 132, a projection optical system 140, a main control unit 150, a monitor and input apparatus 152, a wafer 170, a wafer stage 174, and a supply/recovery mechanism 180 that supplies the fluid 181 as a medium. The exposure apparatus 100 is an immersion type exposure apparatus that partially or entirely immerses the final surface of the final optical element of the projection optical system 140 at the wafer 170 side, and exposes a pattern on the mask 130 onto the wafer 170 via the fluid 181. While the exposure apparatus 100 of the instant embodiment is a projection exposure apparatus in a step and scan manner, the present invention is applicable to a step and repeat manner and other exposure methods.

The illumination apparatus 100 illuminates the mask 130, on which a circuit pattern to be transferred is formed, and includes a light source action and an illumination optical system.

The light source section includes laser 112 as a light source, and a beam shaping system 114. The laser 112 may be a pulsed laser such as an ArF excimer laser with a wavelength of approximately 193 nm, a KrF excimer laser with a wavelength of approximately 248 nm, an $F_2$ laser with a wavelength of approximately 157 nm, etc. A kind of laser, the number of laser units, and a type of light source section is not limited.

The beam shaping system 114 can use, for example, a beam expander, etc., with a plurality of cylindrical lenses, and convert an aspect ratio of the size of the sectional shape of a parallel beam from the laser 112 into a desired value (for example, by changing the sectional shape from a rectangle to a square), thus reshaping the beam shape to a desired one. The beam shaping system 114 forms a beam that has a size and divergent angle necessary for illuminating an optical integrator 118, to be described later.

The illumination optical system 120 is an optical system that illuminates the mask 130, and includes a condenser optical system 116, an optical integrator 118, an aperture stop 120, a condenser lens 122, a deflecting mirror 124, a masking blade 126, and an imaging lens 128, in this embodiment. The illumination optical system 120 can realize various illumination modes, such as conventional illumination, annular illumination, quadrupole illumination, etc.

The condenser optical system 116 includes plural optical elements, and efficiently introduces a beam with the desired shape into the optical integrator 118. For example, the condenser optical system 116 includes a zoom lens system, and controls the shape and angular distribution of the incident beam to the optical integrator 118. The condenser optical system 116 further includes an exposure dose regulator that can change an exposure dose of light for illuminating the mask 130 per illumination.

The optical integrator 118 makes uniform illumination light that illuminates the mask 130, includes a fly-eye lens, in the instant embodiment, for converting an angular distribution of incident light into a positional distribution, thus exiting the light. The fly-eye lens is so maintained that its incident plane and its exit plane are in the Fourier transformation relationship, and a multiplicity of rod lenses (or fine lens elements). However, the optical integrator 118 usable for the present invention is not limited to the fly-eye lens, and can include an optical rod, a diffraction grating, plural pairs of cylindrical lens array plates that are arranged so that these pairs are orthogonal to each other, etc.

Right after the exit plane of the optical integrator 118 is provided the aperture stop 120 that has a fixed shape and diameter. The aperture stop 120 is arranged at a position approximately conjugate to the effective light source on the pupil 142 of the projection optical system 140, as described later, and the aperture shape of the aperture stop 120 corresponds to the effective light source shape on the pupil 142 surface in the projection optical system 140. The aperture shape of the aperture stop 120 defines a shape of the effective light source, as described later. Various aperture stops can be switched so that it is located on the optical path by a stop exchange mechanism (not shown) according to illumination conditions.

The condenser lens 122 collects all the beams that have exited from a secondary light source near the exit plane of the optical integrator 118 and passed through the aperture stop 120. The beams are reflected by the mirror 124, and uniformly illuminate or Koehler-illuminate the masking blade 126.

The masking blade 126 includes plural movable light shielding plates, and has an arbitrary opening corresponding to the effective area shape of the projection optical system 140. The light that has passed through the opening of the masking blade 126 is used as illumination light for the mask 130. The masking blade 126 is a stop having an automatically variable opening width, thus making a transfer area changeable. The exposure apparatus 100 may further include a scan blade, with a structure similar to the above masking blade 126, which makes the exposure changeable in the scan direction. The scan blade is also a stop having an automatically variable opening width, and is placed at an optically approximately conjugate position to the surface of the mask 130. Thus, the exposure apparatus can use these two variable blades to set the dimensions of the transfer area in accordance with the dimensions of an exposure shot.

The imaging lens 128 transfers an opening shape of the masking blade 126 onto the surface of the reticle 130 to be illuminated, and projects a reduced image of a pattern on the reticle 130 onto the wafer 170 held on the holder 172, which will be described later.

The mask 130 has a circuit pattern or a pattern to be transferred, and is supported and driven by a mask stage 132. Diffracted light emitted from the mask 130 passes the projection optical system 140, and then is projected onto the wafer 170. The wafer 170 is an object to be exposed, and the resist is coated thereon. The mask 130 and the wafer 170 are located in an optically conjugate relationship. The exposure apparatus in this embodiment is a step-and-scan type exposure apparatus (i.e., a "scanner"), and, therefore, scans the mask 130 and the wafer 170 to transfer a pattern on the mask 130 onto the wafer 170. When it is a step-and-repeat type exposure apparatus (i.e., a "stepper"), the mask 130 and the wafer 170 are kept stationary for exposure.

The mask stage 132 supports the mask 130, and is connected to a transport mechanism (not shown). The mask stage 132 and the projection optical system 140 are installed on a lens barrel stool supported via a damper, for example, to a base frame placed on the floor. The mask stage 132 can use any structure known in the art. The transport mechanism (not shown) is made up of a linear motor, and the like, and drives the mask stage 132 in X-Y directions, thus moving the mask 130.

The projection optical system 140 serves to image the diffracted light, which has been generated by the patterns formed on the mask 130, onto the wafer 170. The projection optical system 140 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration is available through a plurality of lens units made from glass materials having different dispersion values (Abbe values), or arrange a diffractive optical element such that it disperses in a direction opposite to that of the lens unit. Otherwise, the compensation of the chromatic aberration is done with the narrowing of a spectral width of the laser. Nowadays, a line-narrowed MOPA laser is one typically used.

The main control unit 150 controls driving of each component, and particularly controls the fluid filling based on information inputted from the input device of the monitor and input unit 152, information obtained by the detector 190, and a program stored in a memory (not shown). More specifically, the main control unit 150 controls the supply/recovery mechanism 180, the wafer stage 174, which will be described later, etc., so that the fluid 181 is supplied between the wafer 170 and the final optical element of the projection optical system 140 without mixing the air bubbles in the fluid 181. Control information and other information for the main control unit 150 are indicated on the display of the monitor and input device 152.

The wafer 170 is replaced with a liquid crystal plate and another object to be exposed in another embodiment. The photoresist is coated on a substrate 174. The wafer 170 is mounted on the wafer stage 174 via a holder 172, such as a wafer chuck. The holder 172 may use any holding method known in the art, such as vacuum holding and electrostatic holding, and a detailed description thereof will be omitted. The stage 174 may use any structure known in the art, and preferably utilizes six-axis coax. For example, the stage 174 uses a linear motor to move the wafer 170 in XYZ directions. The mask 130 and wafer 170 are, for example, scanned synchronously, and the positions of the mask stage 132 and wafer stage 174 are monitored, for example, by a laser interferometer, and the like, so that both are driven at a constant speed ratio. The stage 174 is installed on a stage stool supported on the floor, and the like, for example, via a damper. The mask stage 132 and the projection optical system 140 are installed on a barrel stool supported, via a damper, etc., on a base frame mounted on the floor.

The supply/recovery mechanism 180 serves not only to supply the fluid 181 to the space and recover the fluid 181 from the space between the final surface of the projection optical system 140 and the wafer 170, but also to remove the gas or air bubbles from the fluid 181.

The bottom surface of the projection optical system 140 closest to the wafer 170 is immersed in the liquid 180. A material selected for the liquid 180 has good transmittance to the wavelength of the exposure light, does not contaminate the projection optical system 140, and matches the resist process. The fluid 181 is, for example, pure water or a fluorine compound, and selected according to the resist coated on the wafer 170 and the wavelength of the exposure light. The coating of the last element of the projection optical system 140 protects the element from the water.

Figure 2:
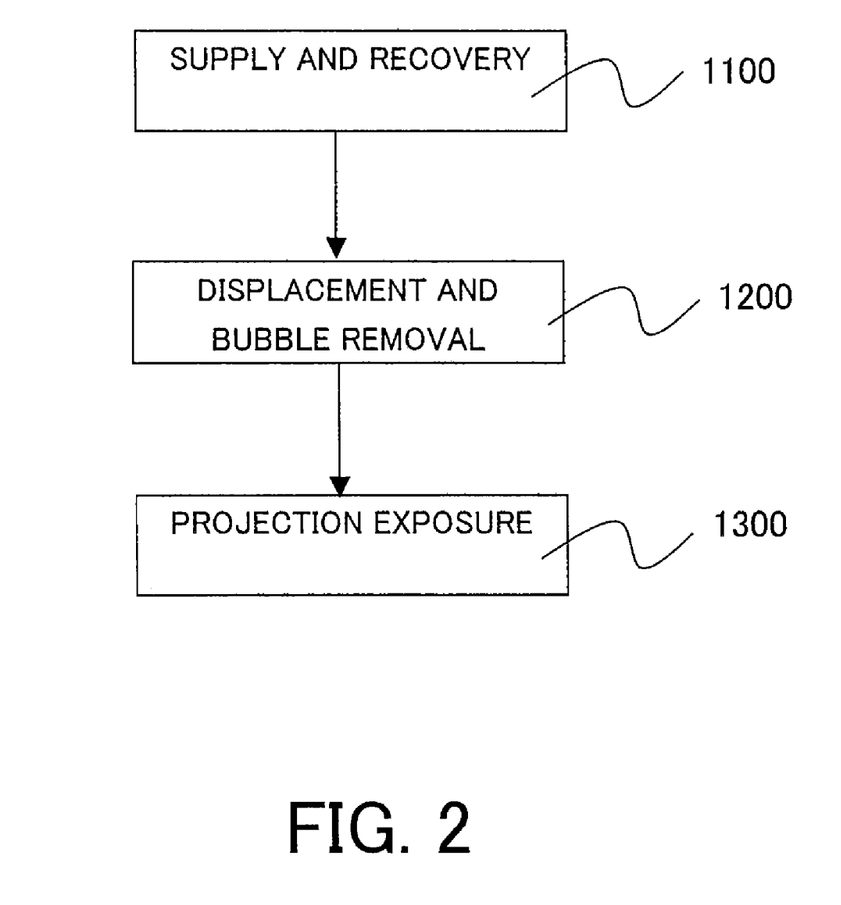
FIG. 2 is a flowchart for explaining an exposure method performed by the exposure apparatus shown in FIG. 1.

Referring now to FIG. 2, a description will be given of an exposure method according to one embodiment of the present invention. Here, FIG. 2 is a flowchart of this exposure apparatus. The exposure method of the instant embodiment includes the steps of filling the fluid 181 between the surface of the wafer 170 and the final surface of the optical element in the projection optical system 140 closest to the wafer 170; continuously supplying and recovering the fluid 181 (step 1100); displacing the fluid surface (or an interface) and eliminating air bubbles from the fluid 181 (step 1200); and projecting a pattern on the mask 130 onto the wafer 170 via the projection optical system 140 and the fluid 181 (step 1300). The step 1200 is conducted always or at a predetermined time. The main control unit 150 controls actions of each component at the time of the supply and recovery of the fluid 181 and the bubble elimination from the fluid 181. The flowchart shown in FIG. 2 is stored in a software or firmware in the memory (not shown), and the main control unit 150 provides exposure based on the software or firmware.

A description will be given of exposure apparatuses according to several embodiments of the present invention.

First Embodiment

Referring now to FIGS. 3A-4B, a description will be given of steps 1100 and 1200 of a first embodiment. Here, FIGS. 3A-4B are schematic, enlarged sectional views near the wafer 170 and the final optical element 144 in the projected optical system 140 closest to the wafer 170 in the steps 1100 and 1200 of the first embodiment. Suppose that the fluid 181 is filled between the surface 171 of the wafer 170 and the bottom surface 145 of the final optical element 144 in the initial state. The supply/recover mechanism 180 of this embodiment includes a supply nozzle 182, a recovery nozzle 184, and a displacement/bubble removal mechanism 190. While air curtains are actually formed outside the supply nozzle 182 and the recovery nozzle 184 in FIGS. 3A-4B, FIGS. 3A-4B omit them for illustration purposes. This is true of the following description.

The supply nozzle 182 continuously or intermittently supplies the fluid 181 to the space between the bottom surface 145 of the optical element 144 and the top surface 171 of the wafer 170. The recovery nozzle 184 continuously or intermittently recovers the fluid 181 from the space between the bottom surface 145 of the optical element 144 and the top surface 171 of the wafer 170.

The displacement/bubble elimination mechanism 190 serves to eliminate the gas or air bubbles from the fluid 181, to displace the fluid surface (or the interface) of the fluid 181, and includes pump 191, pipe 192, valve 193, and a gas-liquid separating membrane 194.

The pump 191 serves as attraction/exhaustion means, and exhausts the gases (or air bubbles) that are transmitted through the gas-liquid separating membrane 194. The present invention does not limit the type of the pump. The pipe 192 is connected to the pump 191 and the supply nozzle 182, and their materials and structure are not limited. Therefore, it may be a pipe made of metal or an elastic material. The valve 193 and the gas-liquid separating membrane 194 are provided between the pump 191 and the supply nozzle 182 in this order. The gas-liquid separating membrane 194 is a porous membrane that transmits the gas but does not transmit the fluid. The gas-liquid separating membrane 194 may apply any structure known in the art according to the type of the fluid 181.

Characteristically, the supply/recovery mechanism 180 of the instant embodiment provides a gas-liquid separating means to the supply nozzle 182. While an upstream supply source (not shown) that supplies the fluid 181 can also have a gas-liquid separating means, the instant embodiment provides an additional gas-liquid separating means to the supply nozzle 182 to eliminate the air bubbles in the pipe. While the displacement/bubble elimination mechanism 190 always works in the instant embodiment, it may work at a predetermined time. The supply/recovery mechanism 180 of the instant embodiment provides a fluid displacement means to the supply nozzle 182.

Figure 3A:
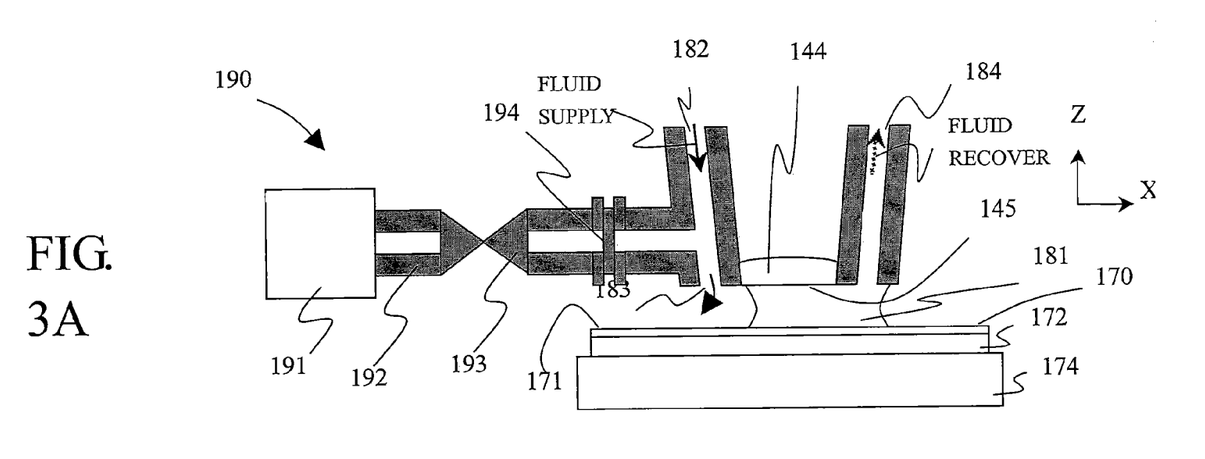
FIGS. 3A and 3B are schematic partially-enlarged sectional views of an exposure apparatus shown in FIG. 1 for explaining a supply/recovery step and a displacement/bubble elimination step in an exposure method of a first embodiment shown in FIG. 2.
Figure 3B:
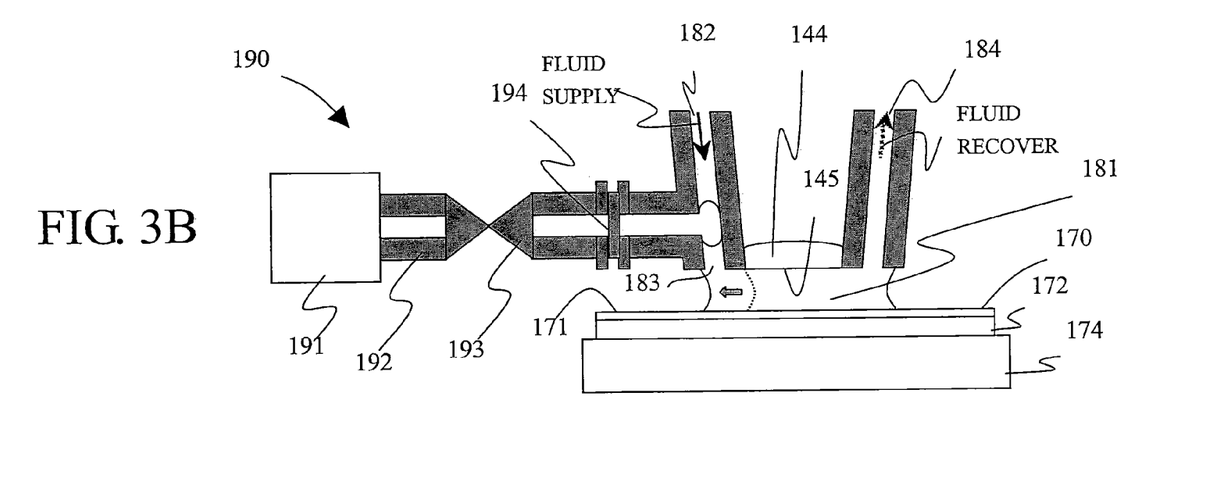

Although FIGS. 3A-3B show only the valve 193 from the gas-fluid separating membrane 194 to the pump 191, there are actually a stop, a mass flow controller, etc. The instant embodiment exemplarily connects the valve 193 between the gas-fluid separating membrane 194 and the pump 191, and the valve 193 may be attached to the supply source of the fluid 181 in the supply nozzle 182, the support port 183, and a space between the branch of the gas-fluid separating membrane 194 and the pump 191.

In initially filling the fluid 181 between the wafer 170 and the optical element 144, the fluid surface of the fluid 181 can often be disconnected from the fluid 181 at the support port 183 of the supply nozzle 182, as shown in FIGS. 3A and 3B. When the supply nozzle 182 supplies the fluid 181 in this state, the fluid surface of the fluid 181 filled between the wafer 170 and the optical element 144 contacts the fluid surface of the fluid 181 supplied from the supply nozzle 182, generating air bubbles at the instant of contacting both fluid surfaces or the fluid 181, and/or spilling the fluid 181 beyond the air curtain as shown in FIGS. 3A and 3B. FIGS. 3A and 3B are schematic, enlarged sectional views for explaining a problem when the valve 193 closes so as not to activate the displacement function in the displacement/bubble elimination mechanism 190.

Figure 4A:
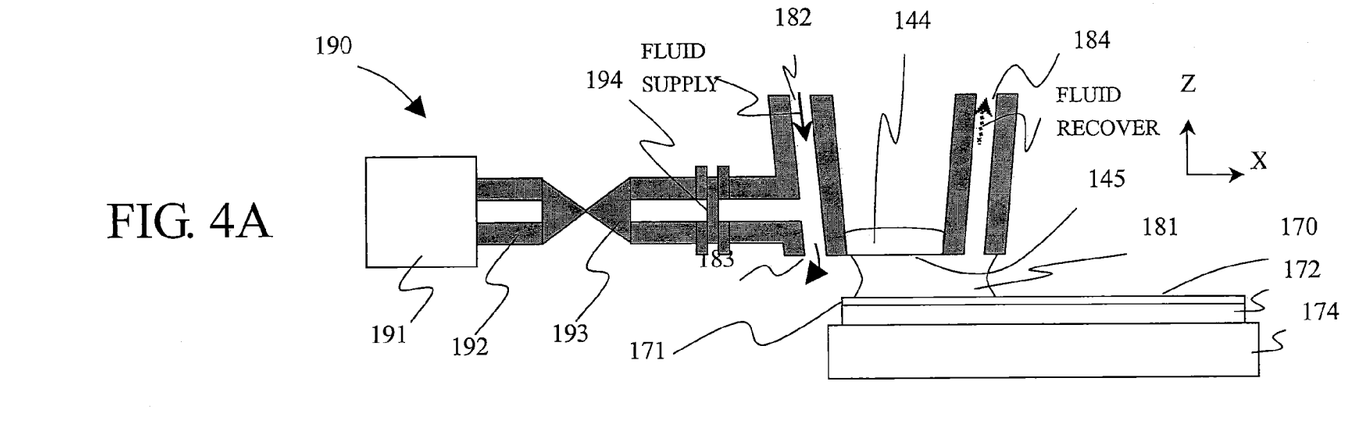
FIGS. 4A and 4B are schematic partially-enlarged sectional views of an exposure apparatus shown in FIG. 1 for explaining a supply/recovery step and a displacement/bubble elimination step in an exposure method of a first embodiment shown in FIG. 2.
Figure 4B:
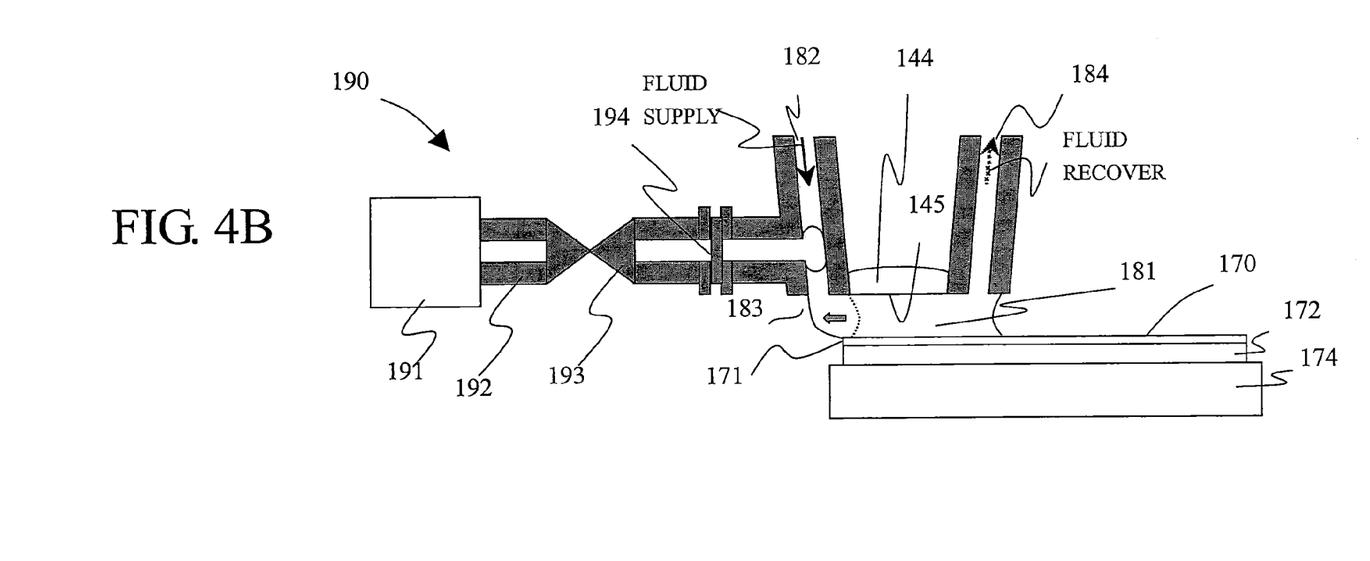

Accordingly, as shown in FIGS. 3B and 4B, the valve 193 in the displacement/bubble elimination mechanism 190 is opened so as to activate the displacement function. As a result, the fluid surface of the fluid 181 displaces below the supply nozzle 182 as shown by an arrow, or towards the upstream side, and the supply port 183 of the nozzle 182 is brought into contact with the fluid 181. Thereby, the fluid is unlikely to spill. At the same time, the air bubble eliminating function of the displacement/bubble elimination mechanism 190 is activated to allow the fluid 181 to transmit through the gas-liquid separating membrane 194 and to eliminate the air bubbles contained in the fluid 181. The air bubbles are exhausted to the outside via the pump 191.

Instead of always executing the step 1200, the main control unit 150 preferably executes the step 1200 when the fluid 181 is initially filled in the space between the wafer 170 and the optical element 144, and when the optical element 144 entirely opposes the wafer 170 after the peripheral exposure.

Then, the procedure moves to the following step 1300.

Second Embodiment

Figures 5A, 5B:
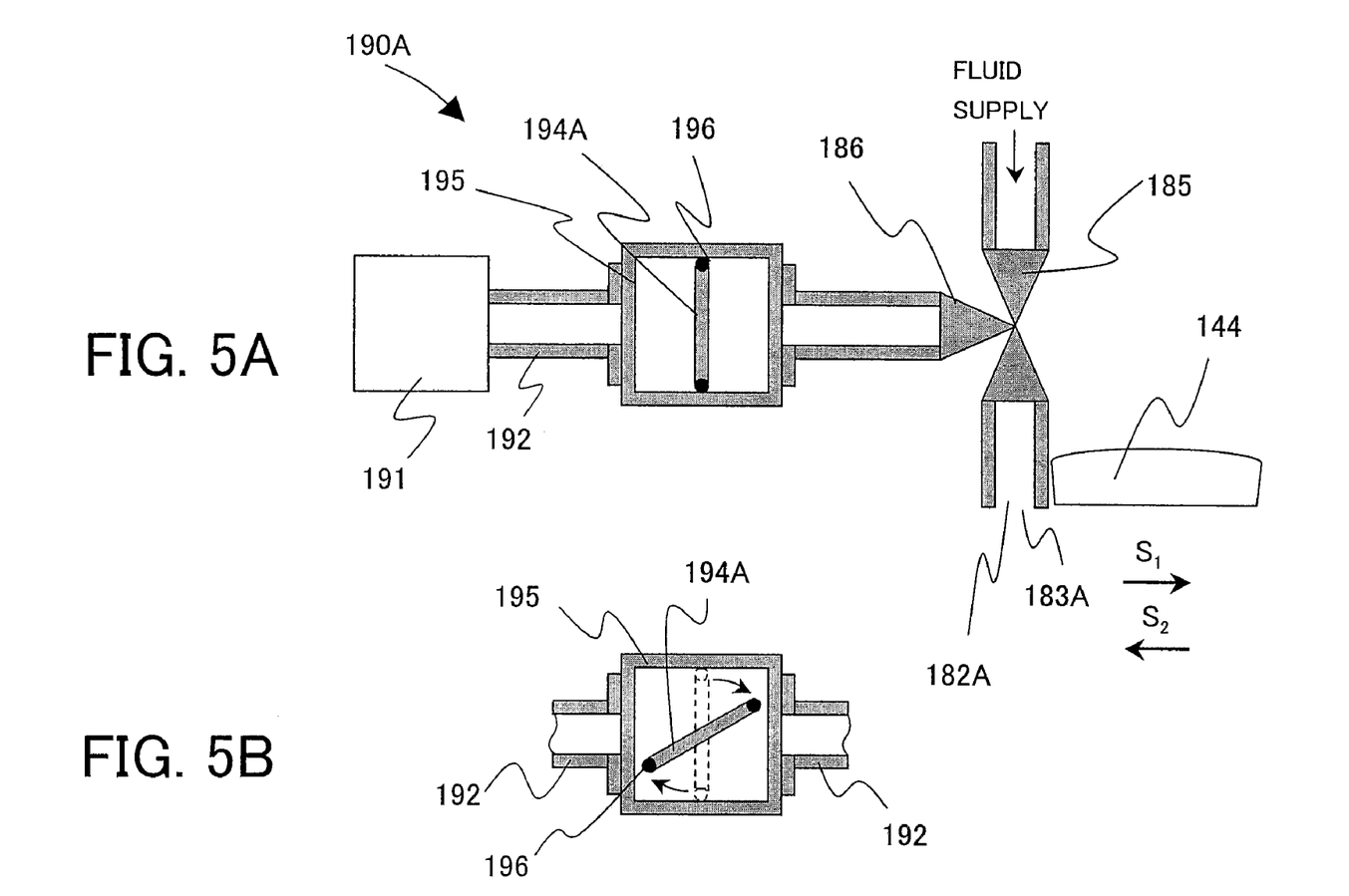
FIGS. 5A and 5B are schematic partially-enlarged sectional views of an exposure apparatus shown in FIG. 1 for explaining a supply/recovery step on a displacement/bubble elimination step in an exposure method of a second embodiment shown in FIG. 2.

Referring to FIGS. 5A and 5B, a description will be given of the steps 1100 and 1200 according to a second embodiment. Here, FIG. 5A is a schematic, enlarged sectional view near the optical element 144 in the projection optical system 140 at the time of the air bubble elimination in the steps 1100 and 1200. FIG. 5B shows a state near the gas-liquid separating membrane 194 at the time of the fluid recovery. The supply/recovery mechanism 180 of this embodiment includes a supply nozzle 182A, a supply-side valve 185, a pump-side valve 186, and a displacement/bubble elimination mechanism 190A. The displacement/bubble elimination mechanism 190A includes a pump 191, a pipe 192, a gas-liquid separating membrane 194A, a valve disc 195, and an O-ring 196. Those elements in FIGS. 5A and 5B, which are corresponding elements in FIGS. 3A-4B are designated by the same reference numerals, and a duplicate description will be omitted.

The first embodiment provides dedicated nozzles for supply and recovery of the fluid 181, i.e., the supply nozzle 182 and the recovery nozzle 184, whereas the second embodiment provides the valves 185 and 186 at the upstream side of the supply port 183A and shares the nozzle for supply and recovery of the fluid 181. The supply nozzle 182A serves as both the supply nozzle and the recovery nozzle. The supply-side valve 185 and the pump-side valve 186 form one valve, and the main control unit 150 controls openings and closings of the valves 185 and 186 in the steps 1100 and 1200. The gas-liquid separating membrane 194A is configured to be rotatable, but structurally similar to the gas-liquid separating membrane 194. The O-ring 196 is attached around the gas-liquid separating membrane 194A. The valve disc 195 is a valve that rotatably supports the gas-liquid separating membrane 194A, can contact and separate from the O-ring 196, and open and close the pipe 192.

A description will now be given of the steps 1100 and 1200.

In supplying the fluid 181 in the step 1100, the main control unit 150 opens the valve 185, and controls the upstream supply source (not shown), and continuously or intermittently supplies the fluid 181 to the space between the wafer 170 and the optical element 144. Then, the main control unit 150 may close the valve 186.

In recovering the fluid 181 in the step 1100, the main control unit 150 closes the valve 185 and opens the valve 186. The main control unit 150 rotates the gas-liquid separating membrane 194A, making the O-ring 196 and the internal wall of the disc valve 195 non-contact, as shown in FIG. 5B. Thereby, the pump 191 can suck up the fluid 181 between the final optical element 144 and the wafer 170 via the pipe 192, recovering the fluid 181.

At the time of the displacement and air bubble elimination in the step 1200, the main control unit 150 closes the valve 185 and opens the valve 186. The main control unit 150 rotates the gas-liquid separating membrane 194A, and makes the O-ring 196 and the internal wall of the disc valve 195 contact, as shown in FIG. 5A. Thereby, it is possible to suck up the fluid 181 between the final optical element 144 and the wafer 170 via the pipe 192 up to or near the gas-liquid separating membrane 194A, eliminating the air bubbles from the pump 191 via the gas-liquid separating membrane 194A. Since the interface of the fluid 181 between the final optical element 144 and the wafer 170 displaces although this state is not shown, the effects described with reference to FIGS. 3B and 4B are obtained. When the valve 185 opens, the fluid 181 between the final optical element 144 and the wafer 170 contacts the fluid 181 supplied from the supply source (not shown) via the nozzle 182A. However, the air bubbles generated due to the fluid surface contact are exhausted to the pump 191 via the gas-liquid separating membrane 194A.

The supply and recovery in the step 1100 are determined by the scan direction $S_1$ and $S_2$ of the wafer stage 174 that is not shown in FIGS. 5A and 5B. Preferably, when the scan direction of the wafer stage 174 is $S_1$, the fluid 181 is supplied. When the scan direction of the wafer stage 174 is $S_2$, the fluid 181 is recovered. The main control unit 150 executes the step 1200 just after the initial filling or at the time of peripheral exposure. In particular, the main control unit 150 determines whether the peripheral exposure is performed based on the positional information of the wafer 170.

While this embodiment describes the action of the gas-liquid separating membrane 194A with a principle of a butterfly valve, the type of the valve is not limited. For example, a gate valve is applicable to the instant embodiment.

Thereafter, the procedure moves to the following step 1300.

Third Embodiment

Figure 6:
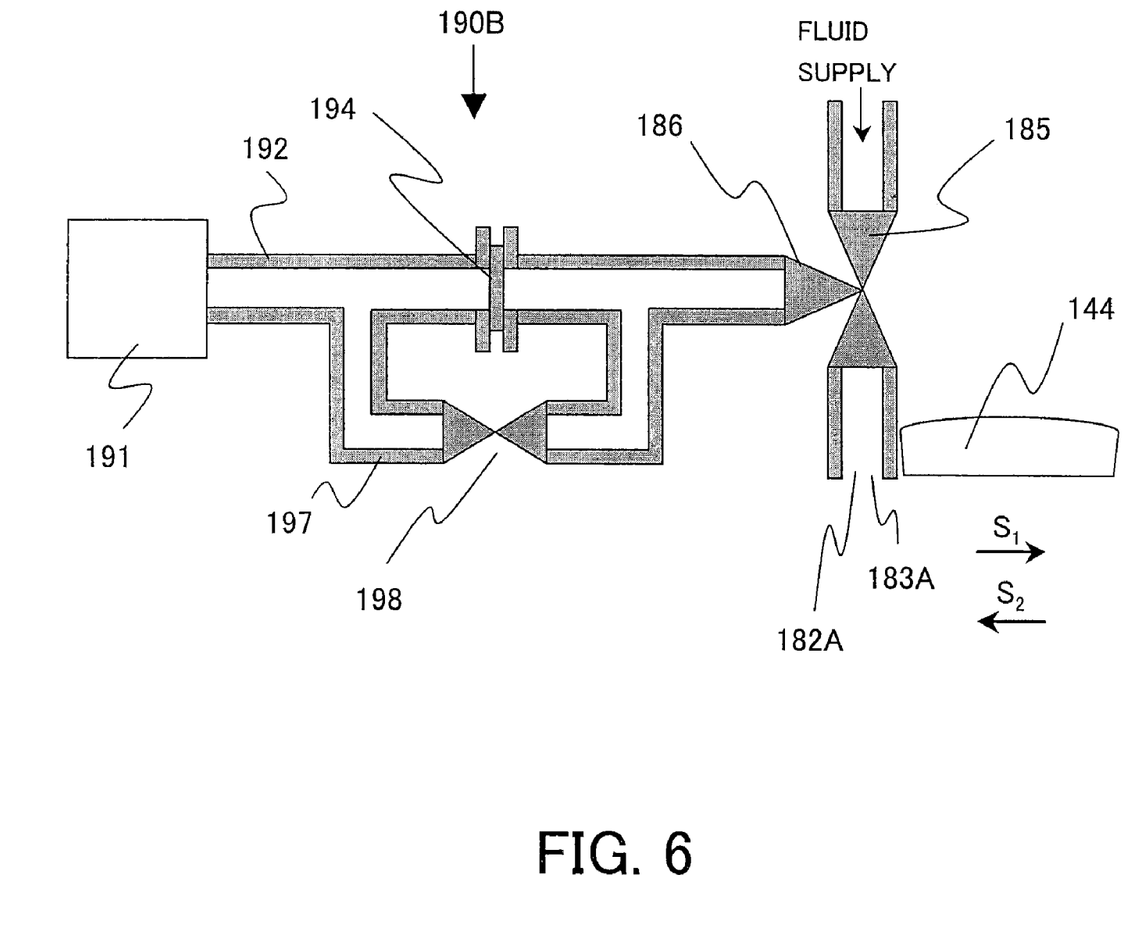
FIG. 6 is a schematic partially-enlarged sectional view of an exposure apparatus shown in FIG. 1 for explaining a supply/recovery step and a displacement/bubble elimination step in an exposure method of a third embodiment shown in FIG. 2.

Referring now to FIG. 6, a description will be given of the steps 1100 and 1200 according to a third embodiment. Here, FIG. 6 is a schematic, enlarged sectional view near the optical element 144 in the projection optical system 140 in the steps 1100 and 1200 according to the third embodiment. Those elements in FIG. 6, which are corresponding elements in FIGS. 5A and 5B, are designated by the same reference numerals, and a duplicate description will be omitted. Similar to the second embodiment, this embodiment provides the valves 185 and 186 at the upstream side of the supply port 183A of the nozzle 182A, and shares the nozzle 182A used to supply and recover the fluid 181. While the second embodiment provides the gas-liquid separating membrane 194 with a valve structure, this embodiment arranges a pipe 197 parallel to the gas-liquid separating membrane 194 and provides the pipe 197 with the valve 198 instead of the gas-liquid separating membrane 194.

A description will now be given of the steps 1100 and 1200.

In supplying the fluid 181 in the step 1100, the main control unit 150 opens the valve 185, and controls the upstream supply source (not shown), and continuously or intermittently supplies the fluid 181 to the space between the wafer 170 and the optical element 144. Then, the main control unit 150 may close the valve 186, or close the valve 186 and open the valve 198. When the main control unit 150 closes the valve 186 and opens the valve 198, the pump 191 is activated.

In recovering the fluid 181 in the step 1100, the main control unit 150 closes the valve 185 and opens the valves 186 and 198. Thereby, the pump 191 can suck up the fluid 181 between the final optical element 144 and the wafer 170 via the pipes 192 and 197, recovering the fluid 181.

At the time of the displacement and air bubble elimination in the step 1200, the main control unit 150 closes the valves 185 and 198 and opens the valve 186. Thereby, it is possible to suck up the fluid 181 between the final optical element 144 and the wafer 170 via the pipe 192 up to or near the gas-liquid separating membrane 194, eliminating the air bubbles from the pump 191 via the gas-liquid separating membrane 194. Since the interface of the fluid 181 between the final optical element 144 and the wafer 170 displaces, although this state is not shown, the effects described with reference to FIGS. 3B and 4B are obtained. When the valve 185 opens, the fluid 181 between the final optical element 144 and the wafer 170 contacts the fluid 181 supplied from the supply source (not shown) via the nozzle 182A. However, the air bubbles generated due to the fluid surface contact are exhausted to the pump 191 via the gas-liquid separating membrane 194A.

The supply and recovery in step 1100 are determined by the scan direction $S_1$ and $S_2$ of the wafer stage 174, which is not shown in FIGS. 5A and 5B. Preferably, when the scan direction of the wafer stage 174 is $S_1$, the fluid 181 is supplied. When the scan direction of the wafer stage 174 is $S_2$, the fluid 181 is recovered. The main control unit 150 executes the step 1200 just after the initial filling or at the time of peripheral exposure. In particular, the main control unit 150 determines whether the peripheral exposure is performed based on the positional information of the wafer 170.

Turning back to FIG. 1, a description will be given of the step 1300. A beam emitted from the laser 112 is reshaped into a desired beam shape by the beam shaping system 144, and then enters the illumination optical system. The condenser optical system 116 guides the beam to the optical integrator 118 efficiently. At that time, the exposure-amount regulator adjusts the exposure dose of the illumination light. The main control unit 150 selects an opening shape and a polarization state as an illumination condition suitable for the mask pattern. The optical integrator 118 makes the illumination light uniform, and the aperture stop 120 sets a desired effective light source shape. The illumination light illuminates the mask under optical illumination conditions via the condenser lens 122, deflecting mirror 124, masking blade 126, and imaging lens 128.

The projection optical system 140 reduces at a predetermined magnification and projects onto the wafer 170 the light that passes the mask 130. The exposure apparatus in the step and scan manner fixes the light source 112 and the projection optical system 140, and synchronously scans the mask 130 and the wafer 170 to expose the entire shots. Then, the wafer stage 174 is stepped to the next shot for a new scan operation. This scan and step are repeated, and many shots are exposed on the wafer 170. The exposure apparatus in the step and repeat manner fixes the mask and wafer 170 during the exposure.

Since the final surface of the projection optical system 140 at the side of the wafer 170 is immersed in the fluid 181 that has a refractive index higher than that of the air, the projection optical system 140 has a higher NA and provides the higher resolution on the wafer 170. In particular, the filling step prevents mixture of the air bubbles and provides a high-quality exposure. Thereby, the exposure apparatus 100 transfers a pattern to a resist with high precision, and provides a high-quality device, such as a semiconductor device, an LCD device, an image pick-up device (e.g., a CCD), and a thin-film magnetic head.

Figure 7:
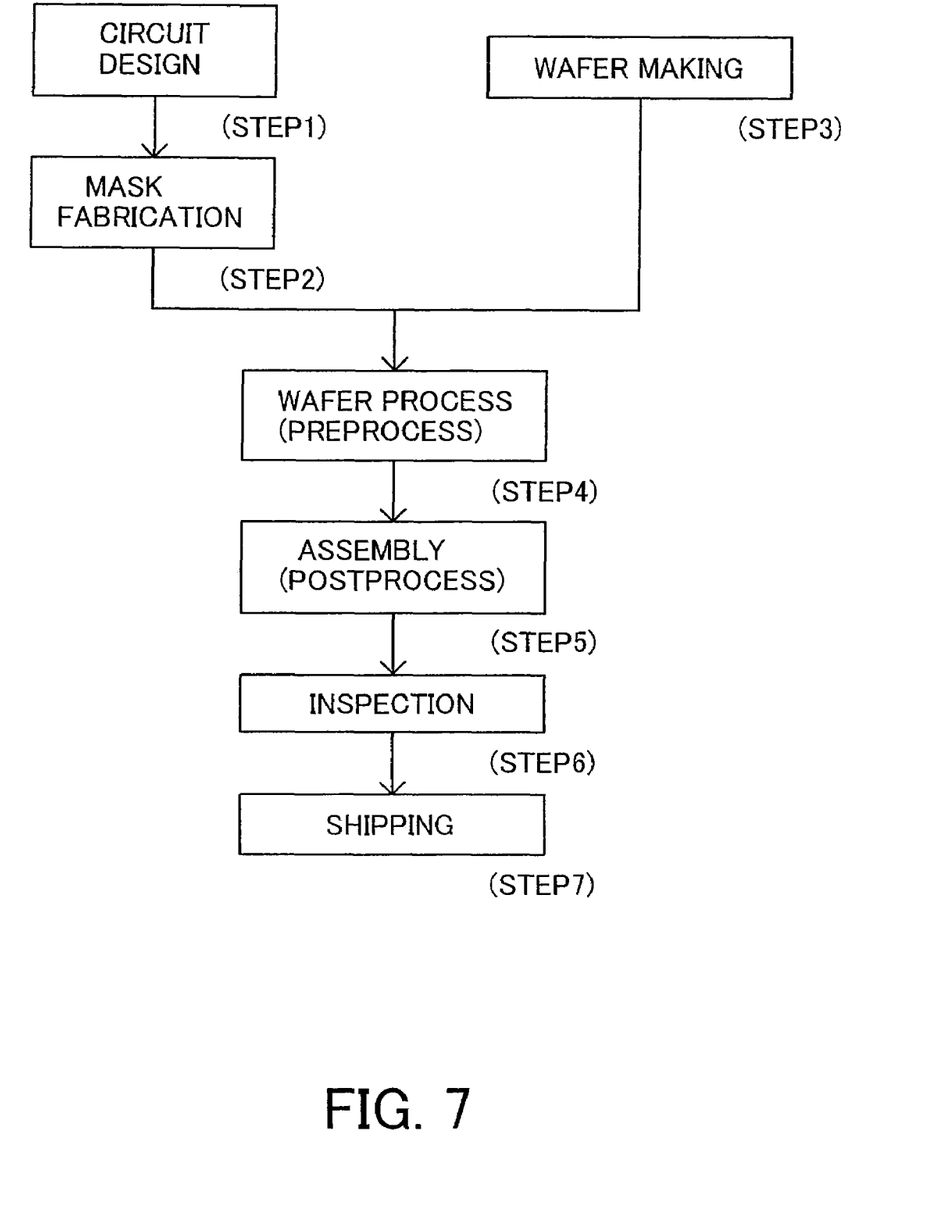
FIG. 7 is a flowchart for explaining a method for fabricating devices (e.g., semiconductor chips such as ICs, LSIs, and the like, LCDs, CCDs, etc.).
Figure 8:
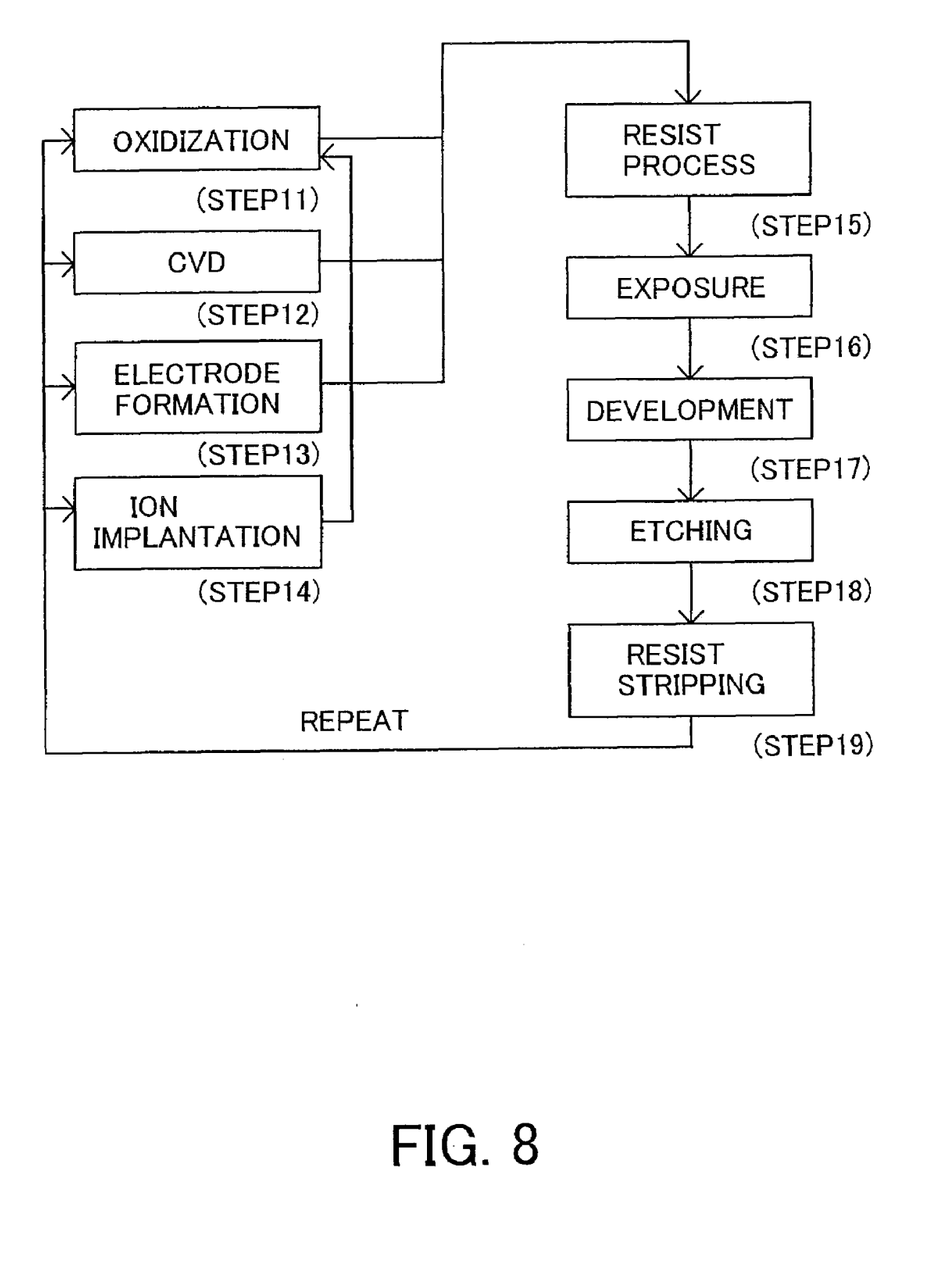
FIG. 8 is a detailed flowchart for Step 4 of the wafer process shown in FIG. 7.

Referring to FIGS. 7 and 8, a description will now be given of an embodiment of a device fabricating method using the above-mentioned exposure apparatus. FIG. 7 is a flowchart for explaining fabrication of devices (i.e., semiconductor chips such as ICs and LSIs, LCDs, CCDs, etc.). Here, a description will be given of fabrication of a semiconductor chip, as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packing step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4 shown in FIG. 7. Step 11 (oxidation) oxidizes the wafer's surface. Step 12 (CVD) forms an insulating film on the wafer's surface. Step 13 (electrode formation) forms electrodes on the wafer by vapor disposition, and the like. Step 14 (ion plantation) implants ions into the wafer. Step 15 (resist process) applies a photosensitive material on the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus, and the devices as finished goods also constitute one aspect of the present invention. The present invention covers devices as intermediate and final products. Such devices include semiconductor chips like LSIs and VLSIs, CCDs, LCDs, magnetic sensors, thin film magnetic heads, and the like.

According to the above embodiments, the immersion type exposure apparatus maintains continuity between the fluid between the object and the final optical element in the projection optical system, and the fluid supplied from the nozzle, and eliminates air bubbles in the fluid. Since the above embodiments enable the residual gas in the pipe for supplying the fluid to be eliminated near the nozzle, a mixture of the gas in the fluid in the exposure area can be prevented. The above embodiments can prevent the deterioration of the transfer accuracy caused by the air bubbles, and realize high-quality exposure. The prompt filling improves the throughput and the productivity of the device manufacturing.

The present invention can provide an exposure method and apparatus, which prevent the mixture of air bubbles and provide the high-quality exposure.

Further, the present invention is not limited to these preferred embodiments, and various variations and modifications may be made without departing from the scope of the present invention. For example, the program that stores the inventive exposure method also constitutes one aspect of the present invention. The bottom surface 145 of the final optical element 144 is not limited to a plane.

This application claims foreign priority benefits based on Japanese Patent Application No. 2003-433008, filed on Dec. 26, 2003, which is hereby incorporated by reference herein in its entirety as if fully set forth herein.

What is claimed is:

1. An exposure apparatus for projecting, via a projection optical system and a fluid, a pattern on a mask onto an object to be exposed, while immersing a surface of the object and a final surface of the projection optical system in the fluid, said exposure apparatus comprising:

a supply nozzle for introducing the fluid between the surface of the object and the final surface of the projection optical system;

a displacement and bubble elimination mechanism, provided to said supply nozzle, for displacing an interface of the fluid between the surface of the object and the final surface of the projection optical system, and for removing gas from the fluid having a displaced interface;

a first valve, provided to said supply nozzle, for turning on and off a supply of the fluid;

a second valve, provided to said displacement and bubble elimination mechanism, for turning on and off a displacement by said displacement and bubble elimination mechanism;

a first pipe connected to said displacement and bubble elimination mechanism and said supply nozzle;

a gas-liquid separator, provided to said first pipe, for removing the gas from the liquid in the supply nozzle;

a second pipe connected to said displacement and bubble elimination mechanism and said supply nozzle parallel to the first pipe; and a third valve, provided to said second pipe, for turning on and off a removal of the gas by said gas-liquid separator and a recovery of the fluid.

* * * * *